United States Patent
Hsu et al.

(10) Patent No.: US 6,221,767 B1
(45) Date of Patent: Apr. 24, 2001

(54) METHOD OF FABRICATING A SILICIDE LANDING PAD

(75) Inventors: Kirk Hsu, Hsinchu Hsien; Yung-Chang Lin, Taichung Hsien; Wen-Jeng Lin, Pan-Chiao, all of (TW)

(73) Assignees: United Microelectronics Corp.; United Silicon Incorporated, both of Hsinchu (TW)

( * ) Notice: Subject to any disclaimer, the term of this patent is extended or adjusted under 35 U.S.C. 154(b) by 0 days.

(21) Appl. No.: 09/428,735

(22) Filed: Oct. 28, 1999

(51) Int. Cl.⁷ .................................................. H01L 21/44
(52) U.S. Cl. ............................................ 438/658; 438/682
(58) Field of Search .................................... 438/597, 652, 438/655, 656, 657, 658, 660, 663, 664, 682, 683, 584

(56) References Cited

U.S. PATENT DOCUMENTS

| | | | |
|---|---|---|---|
| 5,633,196 | * | 5/1997 | Zamanian . |
| 5,756,394 | * | 5/1998 | Manning . |
| 5,843,842 | * | 12/1998 | Lee et al. . |
| 5,863,393 | * | 1/1999 | Hu . |
| 5,915,183 | * | 6/1999 | Gambio et al. . |
| 5,953,605 | * | 9/1999 | Kodama . |
| 5,955,770 | * | 9/1999 | Chan et al. . |
| 5,973,372 | * | 10/1999 | Omid-Zohoor et al. . |
| 6,011,272 | * | 1/2000 | Omid-Zohoor et al. . |
| 6,117,761 | * | 9/2000 | Manning . |
| 6,136,655 | * | 10/2000 | Assaderaghi et al. . |
| 6,147,405 | * | 11/2000 | Hu . |

* cited by examiner

Primary Examiner—Tuan H. Nguyen
Assistant Examiner—Evan Pert
(74) Attorney, Agent, or Firm—Thomas, Kayden, Horstemeyer & Risley

(57) ABSTRACT

A method for fabricating a landing pad is described in which a transistor is formed on the substrate, wherein the transistor comprises a gate and source/drain regions at both sides of the gate in the substrate. A cap layer and a spacer are formed on the gate and at the sidewall of the gate respectively. A protective layer is formed to cover the substrate. The protective layer is then defined to form an opening to expose the source/drain region. A polysilicon landing pad is then formed in the opening and on the protective layer at the periphery of the opening. Silicidation is then conducted on the polysilicon landing pad to form a metal silicide landing pad and to destroy any native oxide at the source/drain region.

14 Claims, 2 Drawing Sheets

METHOD OF FABRICATING A SILICIDE LANDING PAD

BACKGROUND OF THE INVENTION

1. Field of the Invention

The present invention relates to a fabrication method of a semiconductor device. More particularly, the present invention relates to a fabrication method of a landing pad.

2. Description of the Related Art

As semiconductors enter the stage of deep sub-micron processing, the device dimensions are gradually decreased. The fabrication of a landing plug is one approach to increase the aligned margin for photolithography when semiconductor devices become highly integrated.

FIGS. 1A to 1C are schematic, cross-sectional views showing the fabrication of a landing pad, which is applicable to an embedded dynamic random access memory device according to the prior art Referring to FIG. 1A, a device isolation structure 30 is formed on the substrate 10 to define the active regions 15 and 20, wherein the active region 15 is a logic circuit region and the active region 20 is a dynamic random access memory region.

Transistors are formed on the active regions 15 and 20 respectively. Each transistor comprises a gate 40 and source/drain regions 70 in the substrate 10 at both sides of the gate 40. A silicon nitride cap layer 50 is formed on the gate 40 with silicon nitride spacers 60 formed on the sidewalls of the gate 40.

A silicon nitride layer 80 is then formed covering the active region 20. A salicide process is conducted to form a titanium silicide layer 90 on the source/drain regions 70 in the active region 15.

As shown in FIG. 1B, a silicon oxide layer 100 is formed on the active regions 15 and 20, followed by defining the silicon oxide layer 100 and the underlying silicon nitride layer 80 in the active region 20 to form an opening 110 above the source/drain region of the active region 20.

Referring to FIG. 1C, a doped polysilicon type of landing pad 120 is formed in the opening 110 and on the silicon oxide layer 100 at the periphery of the opening 110 to increase the aligned margin for photolithography performed in the subsequent formation of a contact plug. Subsequently an insulation layer (not shown) is then formed, followed by the formation a contact plug (not shown) to complete the manufacturing of an embedded DRAM device.

However, during the entire fabrication process, the wafer is being transferred between the various instruments. When the substrate 10 contacts air, the surface of the substrate 10 is oxidized to form a native oxide layer which affects the contact resistance between the source/drain region 70 and the landing pad 120. Furthermore, the resistance of the doped polysilicon landing pad 120 is higher than either a metal silicide or a metal. The RC delay time is thus greatly increased and the operating efficiency of the entire integrated circuit is adversely affected.

SUMMARY OF THE INVENTION

The present invention provides a fabrication method for a landing pad, in which transistors are formed on the substrate, wherein each transistor comprises a gate and source/drain regions in the substrate at both sides of the gate. A cap layer is formed on the gate and spacers are formed on the sides of the gate. A protective layer is then formed covering the substrate, followed by defining the protective layer to form an opening exposing the source/drain region. A polysilicon landing pad is then formed in the opening and on the protective layer at the periphery of the opening. A silicidation process is then conducted on the polysilicon landing pad to form a metal silicide landing pad.

According to the present invention, the metal silicide landing pad is formed by a silicidation process, which also degrades the oxide layer on the surface of the source/drain region. This invention thus has at least the advantage of increasing the conductivity of the landing pad and of decreasing the contact resistance of the source/drain region. In addition, since the polysilicon landing pad is serving as a buffer layer, the junction quality of the source/drain region is prevented from being damaged during the silicidation process, which also leads to a problem of current leakage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENT

Figure 1A:
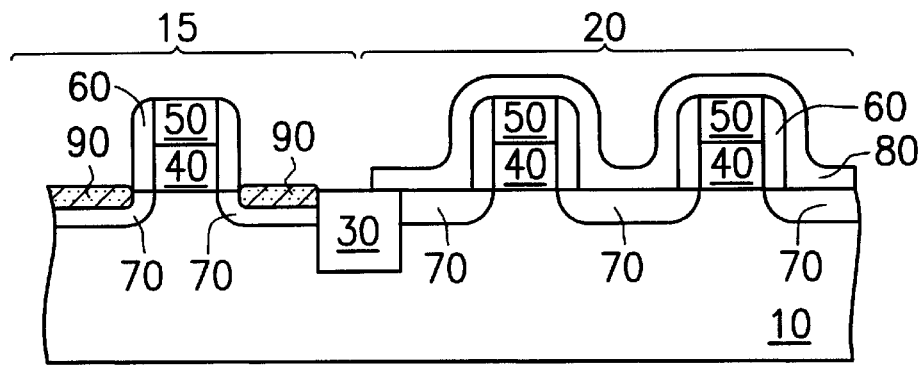
FIGS. 1A to 1C, are schematic, cross-sectional views showing the fabrication of a landing pad, which is applicable to an embedded dynamic random access memory device according to the prior art.
Figure 1B:
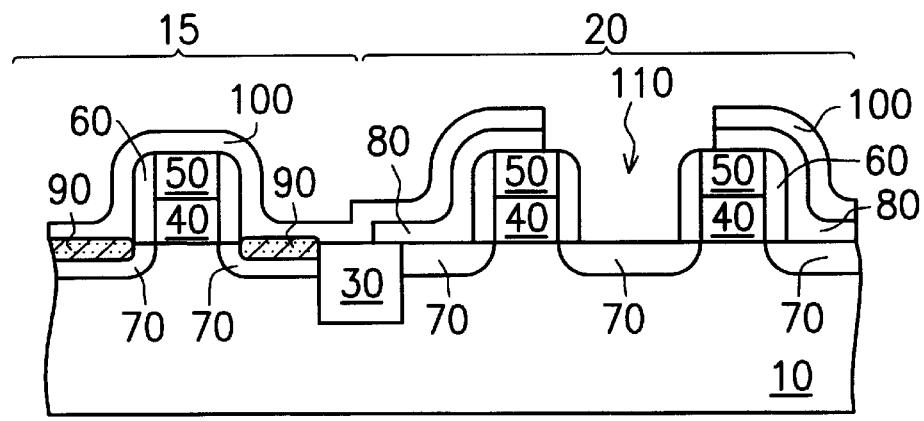
Figure 1C:
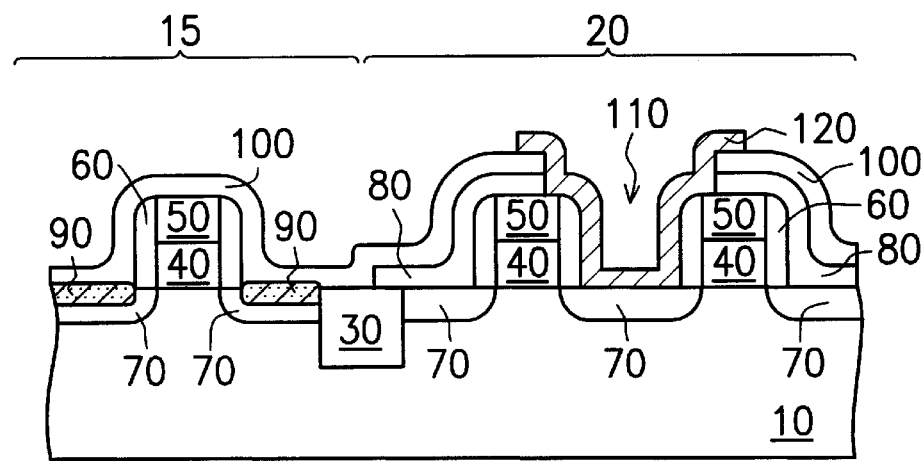
Figure 2A:
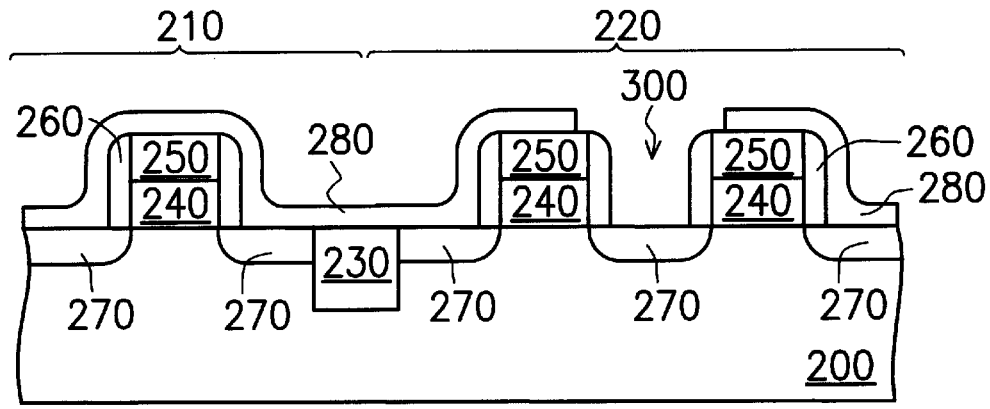
FIGS. 2A to 2C are schematic, cross-sectional views showing the manufacturing of a landing pad, applicable to an embedded dynamic random access memory device according to the preferred embodiment of the present invention.
Figure 2B:
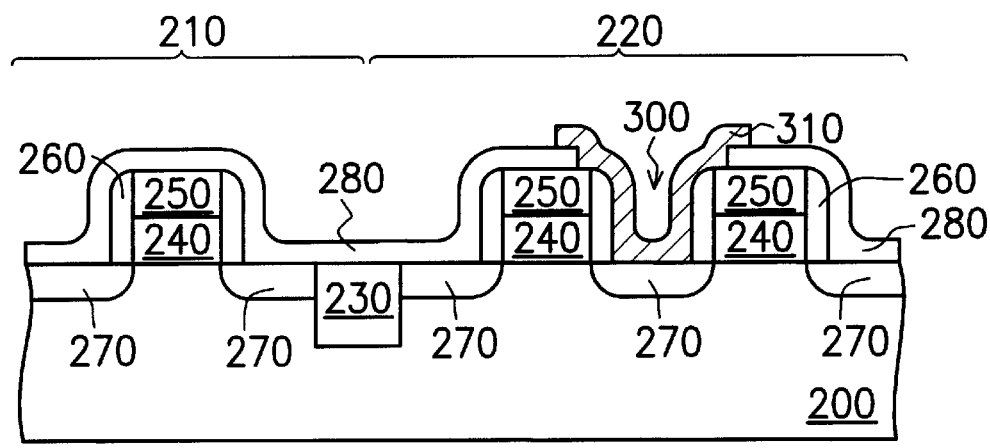
Figure 2C:
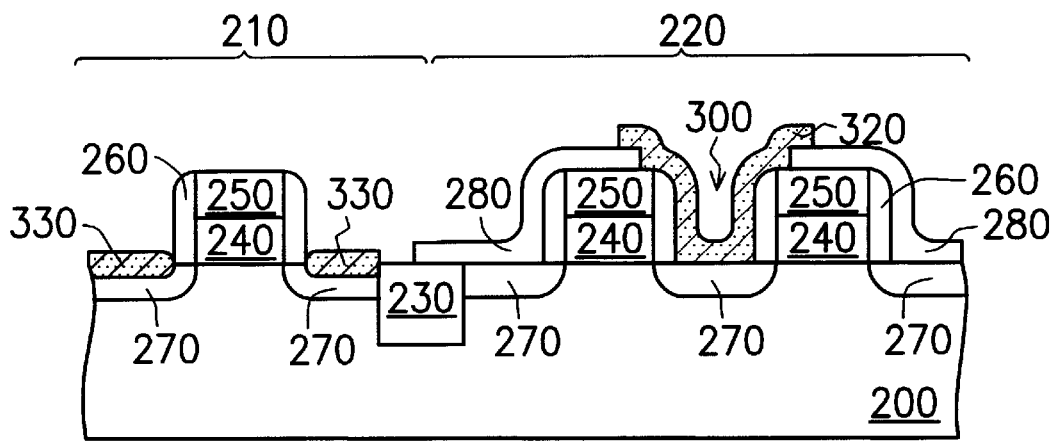

FIGS. 2A to 2C are schematic, cross-sectional views showing the manufacturing of a landing pad, applicable to an embedded dynamic random access memory device according to the preferred embodiment of the present invention.

As shown in FIG. 2A, a device isolation structure 230 is formed on the substrate 200, defining the active regions 210 and 220, wherein the active region 210 is a logic circuit region, and the active region 220 is a dynamic random access memory region. The device isolation structure 230 is, for example, a shallow trench isolation (STI) or a field oxide region (FOX).

Transistors are formed on the active regions 210 and 220 respectively. Each transistor comprises a gate 240 and source/drain regions 270 on both sides of the gate 240 in the substrate 200. A cap layer 250 is formed on the gate 240, and spacers 260 are formed on the sidewalls of the gate 240. The gate 240 is, for example, a polycide. The cap layer 250 and the spacers 260 are, for example, silicon nitride.

Thereafter, a protective layer 280 is formed to cover the substrate 200. The protective layer 280, such as silicon oxide or silicon nitride, is formed, for example, by chemical vapor deposition.

The protective layer 280 is then defined, for example, by photolithography and etching, to form an opening 300 in the active region 220 above the source/drain region 270, exposing the substrate 200 which overlies the source/drain region 270. A native oxide layer (not shown in Figure) may form on the exposed substrate 200 surface when the device is exposed to air in the subsequent process.

As shown in FIG. 2B, a polysilicon landing pad 310 is formed in the opening 300 and on a portion of the protective layer 280 at the periphery of the opening 300. The polysilicon landing pad 310 is formed by, for example, depositing a polysilicon layer by, for example, low pressure chemical vapor deposition using silane ($SiH_4$) as a gas source at a temperature of 600 to 650 degree Celsius and under a pressure of 0.3 to 0.6 torr. Photolithography and etching are further conducted by, for example, reactive ion etching (RIE) using a chlorine ion containing gas source to define the polysilicon layer to form a polysilicon landing pad 310.

As shown in FIG. 2C, the protective layer 280 in the active region 210 is then removed, followed by performing a silicidation process to form a metal silicide landing pad 320 from the polysilicon landing pad 310 in the active region 220, and to form a metal silicide layer 330 above the source/drain region 270 in the active region 210.

The metal silicide landing pad 320 and the metal silicide layer 330 are, for example, titanium silicide or cobalt silicide. Using titanium silicide as an example, the metal silicide landing pad 320 and the metal silicide layer 330 are formed by sputtering a layer of titanium covering the substrate 200. A first rapid thermal process is conducted under a nitride gas at a temperature of 620 to 680 degree Celsius to induce a reaction between titanium and the underlying silicon material to form a C-49 phase titanium silicide on the surfaces of the source/drain region 270 and the polysilicon landing pad 310. Thereafter, the unreacted metal titanium and titanium nitride are removed, followed by performing a second rapid thermal process at 800 to 900 degree Celsius to convert the C-49 phase titanium silicide to a low resistance C-54 phase titanium silicide.

The amount of silicon required to form a metal silicide in the silicidation process is dependent on the type and the amount of the metal. In the formation of titanium silicide, for example, one part of titanium will consume two parts of silicon. In another words, titanium with a thickness of 300 angstroms will consume a polysilicon layer of 600 angstroms thick. On the other hand, in the formation of colbalt silicide, cobalt with a thickness of about 150 angstroms will consume polysilicon with a thickness of about 540 angstroms. In general, titanium is usually sputtered to a thickness of about 250 angstroms to about 400 angstroms, while cobalt is normally sputtered to a thickness of about 100 angstroms to about 250 angstroms. The thickness of polysilicon landing pad 310 is, therefore, about 400 angstroms to about 800 angstroms, which is slightly less than the required amount of silicon to be consumed in the silicidation process to form a metal silicide. As a result, the silicon on the surface of the source/drain region is completely consumed in the reaction, destroying the native oxide layer on the substrate surface.

In the silicidation process, a polysilicon landing pad 310 is converted to a metal silicide landing pad 320. During this process, the native oxide layer on the surface of the source/drain region 270 underneath the polysilicon landing pad 310 is destroyed due to the reaction between metal and silicon. The contact resistance between the source/drain region 270 and the metal silicide landing pad 320 is thereby reduced. In addition, the resistance of the metal silicide landing pad 320 is also lower than the resistance of the polysilicon landing pad 310, which can significantly lower the RC delay time and improve the device operating efficiency.

In generally, to lower the refresh frequency in a DRAM region, the potential of a current leakage must be minimized. If the source/drain region 270 is covered by a layer of polysilicon landing pad 310, which can adequately provide the amount of silicon for the subsequent silicidation process. The silicon of the source/drain region is thereby preserved. As a result, the integrity of the junction area of the source/drain region is retained and the problem of junction leakage is avoided.

The remaining processing procedures for the fabrication of an embedded DRAM device, such as the formation of an insulation layer and the landing plug, are familiar to those who are skilled in the art, and thus will not be reiterated in the present preferred embodiment.

The present invention comprises at least the following advantages. The oxide layer on the surface of the source/drain region is destroyed during the silicidation process in forming the metal silicide landing pad. As a result, not only the conductivity of the landing pad is also increased, the contact resistance between the source/drain region and the landing pad is decreased to significantly lower the RC delay time and improve the device operating efficiency. In addition, with the polysilicon landing pad serving as a buffer layer in the silicidation process, the silicon material in the source/drain region is not overly consumed to destroy the quality of the junction which causes the problem of a junction leakage. Furthermore, the fabrication method of the present invention is compatible with the conventional practice of the manufacturing for an embedded DRAM device.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A fabrication method for a landing pad, which is applicable to a substrate with a plurality of transistors thereon and the transistors comprising a plurality of gates with a plurality of source/drain regions formed at both sides of the gates, and a plurality of cap layers and a plurality of spacers formed on the gates and at sidewalls of the gates respectively, the method comprising the steps of:

forming a protective layer to cover the substrate;

defining the protective layer to form a plurality of openings to expose one part of the source/drain regions;

forming a plurality of polysilicon landing pads in contact with said one part of the source/drain regions in the openings and on the protective layer at a periphery of the openings thus forming an interface between said polysilicon landing pads and said one part of the source/drain regions; and conducting silicidation on the polysilicon landing pads to form a plurality of metal silicide landing pads, including silicidation of said interface.

2. The fabrication method for a landing pad according to claim 1, wherein the protective layer includes a silicon oxide layer.

3. The fabrication method for a landing pad according to claim 1, wherein the protective layer includes a silicon nitride layer.

4. The fabrication method for a landing pad according to claim 1, wherein the protective layer is formed by chemical vapor deposition.

5. The fabrication method for a landing pad according to claim 1, wherein the metal silicide landing pad includes titanium silicide.

6. The fabrication method for a landing pad according to claim 1, wherein the metal silicide landing pad includes cobalt silicide.

7. The fabrication method for a landing pad according to claim 1, wherein the thickness of the polysilicon landing pad is slightly less than required in a salicidation process.

8. A fabrication method for a landing pad, which is applicable to an embedded dynamic random access memory device comprising a plurality of first transistors formed on the logic circuit region and with each of the first transistors comprising a first gate and two first source/drain regions at two sides of the first gate in the substrate and a first cap layer and a first spacer on the first gate and at a sidewall of the first gate respectively, and a plurality of second transistors formed on the dynamic random access memory region with each of the second transistors comprising a second gate and two second source/drain regions at two sides of the second gate in the substrate and a second cap layer and a second spacer formed on the second gate and at a sidewall of the second gates respectively, the method comprising the steps of:

forming a protective layer to cover the substrate;

defining the protective layer to form a plurality of openings to expose the source/drain regions of the dynamic random access memory region;

forming a plurality of polysilicon landing pads in contact with said source/drain regions of the dynamic random access memory region in the openings and on the protective layer at a periphery of the openings thus forming an interface between said polysilicon landing pads and said source/drain regions of the dynamic random access memory region;

removing the protective layer in the logic region; and conducting silicidation on the polysilicon landing pad to form a plurality of metal silicide landing pad in the dynamic random access memory region and a plurality of metal silicide layer distributed on each of the source/drain regions in the logic circuit, including silicidation of said interface.

9. The fabrication method for a landing pad according to claim 8, wherein the protective layer includes a silicon oxide layer.

10. The fabrication method for a landing pad according to claim 8, wherein the protective layer includes a silicon nitride layer.

11. The fabrication method for a landing pad according to claim 8, wherein the protective layer is formed by chemical vapor deposition.

12. The fabrication method for a landing pad according to claim 8, wherein the metal silicide landing pad and the metal silicide layer are titanium silicide.

13. The fabrication method for a landing pad according to claim 8, wherein the metal silicide landing pad and the metal silicide layer are cobalt silicide.

14. The fabrication method for a landing pad according to claim 8, wherein the polysilicon landing pad is slightly less than required in a silicidation process.

* * * * *